United States Patent [19]

McLaughlin

[11] Patent Number: 4,638,186

[45] Date of Patent: Jan. 20, 1987

[54] BIMOS LOGIC GATE

[75] Inventor: Kevin L. McLaughlin, Chandler, Ariz.

[73] Assignee: Motorola, Inc., Schaumburg, Ill.

[21] Appl. No.: 803,691

[22] Filed: Dec. 2, 1985

[51] Int. Cl.[4] .............................................. H03K 19/01
[52] U.S. Cl. ................................... 307/446; 307/570; 307/270
[58] Field of Search ............... 307/443, 446, 270, 570, 307/454

[56] References Cited

U.S. PATENT DOCUMENTS 4,425,516  1/1984  Wanlass ................................ 307/446

FOREIGN PATENT DOCUMENTS 0145004  6/1985  European Pat. Off. ............ 307/446

Primary Examiner—Stanley D. Miller
Assistant Examiner—M. R. Wambach
Attorney, Agent, or Firm—William E. Koch

[57] ABSTRACT

A BIMOS circuit is provided wherein an output terminal is coupled between upper and lower NPN push-pull transistors for providing high current drive capability along with no d.c. power dissipation. A first MOS transistor circuit is coupled between an input terminal and the lower transistor for biasing the lower transistor. A second MOS transistor circuit is coupled between the input terminal and the upper transistor for biasing the upper transistor. A third circuit is coupled between the input terminal and the lower transistor and is responsive to the output terminal for biasing the lower transistor.

6 Claims, 2 Drawing Figures

BIMOS LOGIC GATE

FIELD OF THE INVENTION

This invention relates in general to semiconductor integrated circuit logic gates and, more particularly, to BIMOS logic gates having high input impedance, low power dissipation and high noise immunity of CMOS devices while maintaining the high drive capability and increased switching speed associated with bipolar devices.

BACKGROUND OF THE INVENTION

Increased semiconductor technology has provided for the ability to fabricate a large number of semiconductor devices on one single chip. Bipolar circuits typically provide fast gate speeds, reduced delay per unit load, and have historically been the predominate technology applied in integrated circuits. CMOS (complimentory metal-oxide-semiconductor) structures provide high noise immunity, high input impedance, and low power requirements, and have rapidly gained acceptance in the industry. However, a large CMOS structure is required when driving large capacitive loads and in most cases, several stages of scaled CMOS inverters are necessary in order to minimize the total delay. For BIMOS arrays having a large number of devices, it is desirable that each CMOS device be of small size. As the size of a MOS device is reduced, the transconductance of the device and consequently the ability to drive a heavy capacitive load is also reduced. Bipolar devices continue to be used for driving these capacitive loads due to their high current gain. In quiesent periods, the bipolar push-pull transistors do not dissipate power. During transient periods, the bipolar current gain allows faster charging and discharging of capacitive loads. This results in a significant decrease in metal and fanout delays. Furthermore, smaller CMOS devices may be used in the BIMOS circuit than those required in an all-CMOS device circuit. Attempts to combine bipolar and MOS technology to achieve all of these results have been numerous in recent years.

One previously known circuit combining bipolar and MOS devices comprises a pair of push-pull NPN transistors. The upper NPN transistor has a collector connected to a first voltage source and the source of a P-channel device, an emitter connected to an output terminal and the collector of the lower NPN transistor, and a base connected to an input terminal and the gates of the P-channel device and an N-channel device. The lower NPN transistor has an emitter connected to a second voltage source and the source of the N-channel device, and a base connected to the drains of the P-channel and the N-channel devices. However, this circuit has a low impedance at the input terminal since the input terminal is connected to the base of the upper NPN transistor, and as the output switches from low to high, the lower transistor is slow to turn off causing a slow transition to the high output.

Another previously known circuit is described in U.S. patent application Ser. No. 647,216 and "BICMOS Technology for High-Performance VLSI Circuits", VLSI DESIGN, page 98, August 1984. A BIMOS circuit comprises upper and lower NPN push-pull transistors having an output terminal coupled therebetween. A P-channel device has a source and a drain connected to the collector and base, respectively, of the upper transistor. An N-channel device has a source and drain connected to the base and collector, respectively, of the lower transistor. The gates of the P-channel and N-channel devices are connected to an input terminal.

Yet another previously known circuit is described in "CMOS Digital Technology", ELECTRONIC DESIGN, page 106, Oct. 4, 1984. Upper and lower NPN push-pull transistors have an output terminal coupled therebetween. A P-channel device has a source and drain connected to the collector and base, respectively of the lower NPN transistor. An N-channel device has a drain and source connected to the base and emitter, respectively, of the lower NPN transistor. The gates of the P-channel and N-channel devices and the base of the upper NPN transistor are connected to an input terminal. Although this circuit provides high input impedance, low power dissipation, high noise immunity, and high drive capability, the switching speed is not optimum.

Thus, what is needed is an integrated circuit combining, CMOS and bipolar technology having a high input impedance, improved switching characteristics, low power requirements, high noise immunity, high drive capability and improved power dissipation.

SUMMARY OF THE INVENTION

Accordingly, it is an object of the present invention to provide an improved BIMOS logic gate.

Another object of the present invention to provide an improved BIMOS logic gate having improved output signal switching characteristics.

A further object of the present invention to provide an improved BIMOS logic gate having low power requirements.

Still another object of the present invention to provide an improved BIMOS logic gate having a high input impedance.

Yet another object of the present invention is to provide an improved BIMOS logic gate having high drive capability.

Another object of the present invention to provide an improved BIMOS logic gate having high noise immunity.

In carrying out the above and other objects of the invention in one form, there is provided a BIMOS circuit comprising an output terminal coupled between upper and lower NPN push-pull transistors for providing high current drive capability along with no d.c. power dissipation. A first MOS transistor circuit is coupled between an input terminal and both the output terminal and the lower transistor for sinking current from the output terminal. A second MOS transistor circuit is coupled between the input terminal and the upper transistor for biasing the upper transistor. A third MOS transistor circuit is coupled between the input terminal and the lower transistor and is responsive to the second MOS transistor circuit for biasing the lower transistor.

The above and other objects, features, and advantages of the present invention will be better understood from the following detailed description taken in conjunction with the accompanying drawings.

DETAILED DESCRIPTION OF THE INVENTION

Figure 1:
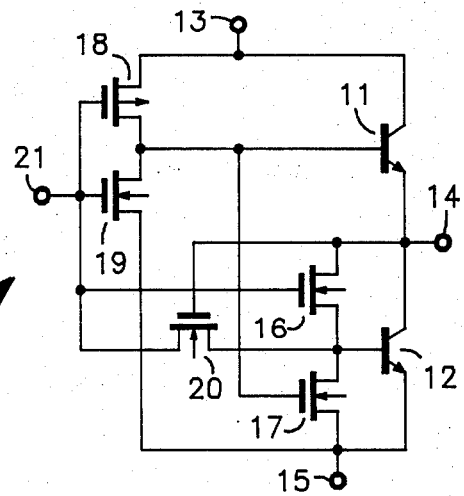
FIG. 1 is a schematic of the preferred embodiment of the present invention.

Referring to FIG. 1, a circuit in accordance with the present invention is shown which is suitable to be fabricated in monolithic integrated circuit form. NPN transistors 11 and 12 comprise a pair of push-pull output transistors. Transistor 11 has its collector and emitter connected, respectively, to supply voltage terminal 13 and output terminal 14. Transistor 12 has its collector and emitter connected, respectively, to output terminal 14 and supply voltage terminal 15. Supply voltage terminal 15 is typically ground.

N-channel MOS transistor 16 has its drain and source connected, respectively, to output terminal 14 and the base of transistor 12. N-channel MOS transistor 17 has its drain and source connected, respectively, to the base of transistor 12 and supply voltage terminal 15. P-channel MOS transistor 18 has its source connected to supply voltage terminal 13, and its drain connected to the gate of transistor 17, the base of transistor 11 and the drain of N-channel MOS transistor 19. N-channel MOS transistor 19 has its drain and source connected, respectively, to the base of transistor 11 and supply voltage terminal 15. The gates of transistors 16, 18 and 19 are connected to input terminal 21. N-channel MOS transistor 20 has its source connected to input terminal 21, its drain connected to the base of transistor 12, and its gate connected to output terminal 14.

When the input signal on terminal 21 switches from a digital high to a digital low, transistors 18 and 11 are rendered conductive and the voltage on supply voltage terminal 13 is provided through transistor 11 to output terminal 14. Transistors 16 and 19 are rendered non-conductive. Transistor 20 is rendered conductive, applying the low input signal to the base of transistor 12. Transistor 17 is rendered conductive, sinking current from the base of transistor 12 that had been applied when the input signal was high. Transistor 17 may alternatively be a resistor or omitted entirely.

When a digital high signal is applied to input terminal 21, transistors 18 and 11 will be rendered non-conductive, thereby precluding the voltage on supply voltage terminal 13 from appearing on output terminal 14. Transistors 19, 16 and 12 will be enabled, thereby sinking current from the base of transistor 11 and output terminal 14. Transistor 20 will be rendered conductive for providing additional current to the base of transistor 12. Transistor 17 will be rendered non-conductive. Input terminal 21 will have a high impedance since it is connected only to the gates of MOS transistors 16, 18 and 19. Output terminal 14 will have the high current characteristics of the bipolar push-pull transistors, thereby reducing the delays associated with the long metal lines on an integrated circuit and the fan out to a number of devices which all contribute to the parasitic capacitance load on terminal 14.

Figure 2:
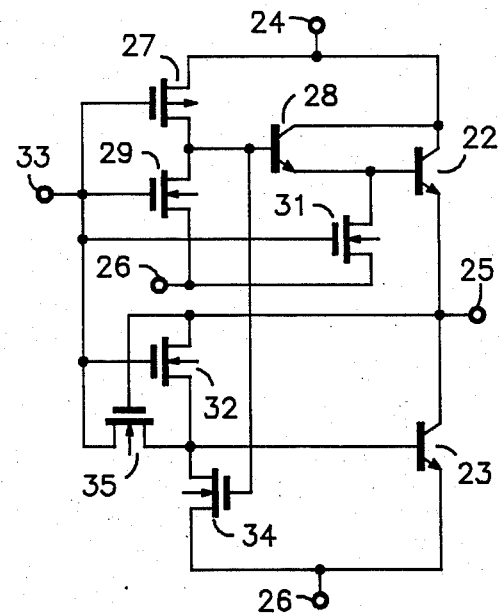
FIG. 2 is a schematic of a second embodiment of the present invention.

Referring to FIG. 2, a second embodiment of the invention comprises a pair of push-pull output transistors 22 and 23. Transistor 22 has its collector and emitter connected, respectively, to supply voltage terminal 24 and output terminal 25. Transistor 23 has its collector and emitter connected, respectively, to output terminal 25 and supply voltage terminal 26. Supply voltage terminal 26 is typically ground. P-channel MOS transistor 27 has its source and drain connected, respectively, to supply voltage terminal 24 and the base of transistor 28. N-channel MOS transistor 29 has its drain and source connected, respectively, to the base of transistor 28 and supply voltage terminal 26. Transistor 28 has a collector connected to supply voltage terminal 22 and an emitter connected to the base of transistor 22. N-channel MOS transistor 31 has its drain and source connected, respectively, to the base of transistor 22 and supply voltage terminal 26.

N-channel MOS device 32 has its drain and source connected, respectively, to output terminal 25 and the base of transistor 23. The gates of transistors 27, 29, 31 and 32 are connected to input terminal 33. N-channel MOS transistor 34 has its drain and source connected, respectively, to the base of transistor 23 and supply voltage terminal 26. The gate of transistor 34 is connected to the base of transistor 28. N-channel MOS transistor 35 has its source and drain connected, respectively to the base of transistor 23 and input terminal 33. The gate of transistor 35 is connected to output 25.

When the input signal on terminal 33 switches from a digital high to a digital low, transistors 27, 28, and 22 are rendered conductive and the voltage on supply voltage terminal 24 is provided through transistor 22 to output terminal 25. Transistors 29, 31 and 32 are rendered non-conductive. Transistor 35 is rendered conductive, applying the low input signal to the base of transistor 23. Transistor 34 is rendered conductive, sinking current from the base of transistor 23 that had been applied when the input signal was high. Transistor 34 may alternatively be a resistor or omitted entirely.

When a digital high signal is applied to input terminal 33, transistors 29 and 31 will be enabled, thereby pulling the base of transistor 22 down and ensuring a more rapid transition of transistor 22 to an off state, and transistors 27 and 28 are disabled so that no current is supplied to the base of transistor 22. Transistor 32 is enabled, thereby applying any current available on output terminal 25 to the base of transistor 23, thus pulling output terminal down to the voltage of supply voltage terminal 26. Input terminal 33 will have a high impedance since it is connected only to the gates of MOS transistors 27, 29, 31 and 32. Output terminal 25 will have the high current characteristics of the bipolar push-pull transistors, thereby reducing the delays associated with the long metal lines on an integrated circuit and the fan out to a number of devices which all contribute to the parasitic capacitance load on terminal 25.

Although the circuits described herein illustrate NPN transistors, P-channel and N-channel MOS transistor, various combinations of PNP transistors and MOS transistors may be used in a manner known to those skilled in the art in order to accomplish the teachings of this invention. Furthermore, although only two logic gates have been described, the invention may also be used to enhance other types of gates.

The invention described herein can be used for internal circuits to improve Very Large Scale Integration (VLSI) performance as well as output drivers. In a gate array or standard cell based VLSI, the device size is uniform for ease of physical design. As a result, the delay degradation per unit load for CMOS is generally different for different circuit functions due to the difference in output impedance of various circuit configurations. For the invention described herein, the unit load degradation is practically the same for all circuit functions because the bipolar push-pull transistors isolate the CMOS circuits from the loading. This leads to ease of applications in semi-custom environments. The bipolar transistors also make ECL input/output (i.e., high performance RAM's) much easier to achieve. The invention can also be used in word line drivers, bit line drivers and sense amplifiers to improve performance.

Another application is a gate array with mixed TTL and ECL input/output on the same chip. This feature is desirable in high performance disk drives, test systems and high speed graphics applications.

By now it should be appreciated that there has been provided a BIMOS circuit having improved output voltage switching speed, low power requirements, high input impedance, high noise immunity, and high current output capability.

I claim:
1. A circuit comprising:
a first supply voltage terminal;
a second supply voltage terminal;
an input terminal;
an output terminal;
a first bipolar transistor having its collector-emitter current path coupled between said first supply voltage terminal and said output terminal;
a second bipolar trnsistor having its collector-emitter current path coupled between said output terminal and said second supply voltage terminal;
first means coupled between said first and second supply voltage terminals and coupled to said input terminal and a base of said first transistor for providing a voltage for biasing said first transistor, said first means providing a high impedance to said input terminal;
second means coupled between said output terminal and a base of said second bipolar transistor and coupled to said input terminal for biasing said second transistor; and
third means coupled between said input terminal and said base of said second bipolar transistor and coupled to said output terminal for further biasing said second bipolar transistor.

2. The circuit according to claim 1 wherein said first means comprises:

a first P-channel MOS transistor having a source coupled to said first supply voltage terminal, a gate coupled to said input terminal, and a drain coupled to said base of said first bipolar transistor;
a first N-channel MOS transistor having a source coupled to said second supply voltage terminal, a gate coupled to said input terminal, and a drain coupled to said base of said first bipolar transistor.

3. The circuit according to claim 2 wherein said second means comprises:
a second N-channel MOS transistor having a drain coupled to said output terminal, a source coupled to a base of said second bipolar transistor, and a gate coupled to said input terminal; and
a third N-channel MOS transistor having a drain coupled to the base of said second bipolar transistor, a source coupled to said second supply voltage terminal, and a gate coupled to said drain of said first P-channel MOS transistor.

4. The circuit according to claim 2 wherein said second means comprises:
a second N-channel MOS transistor having a drain coupled to said output terminal, a source coupled to a base of said second bipolar transistor, and a gate coupled to said input terminal; and
a resistor coupled between said base of said second bipolar transistor and said second supply voltage terminal.

5. The circuit according to claim 2 further comprising:
a third bipolar transistor coupled between said first supply voltage terminal and said base of said first bipolar transistor and having a base coupled to said drain of said first P-channel MOS transistor; and
a third N-channel MOS transistor coupled between said base of said first bipolar transistor and said second supply voltage terminal, and having a gate coupled to said input terminal.

6. The circuit according to claim 1 wherein said third means comprises a first N-channel MOS transistor having a source coupled to said input terminal, a drain coupled to said base of said second bipolar transistor, and a gate coupled to said output terminal.

* * * * *